(12) United States Patent
Shimizu et al.

(10) Patent No.: US 6,239,486 B1
(45) Date of Patent: May 29, 2001

(54) SEMICONDUCTOR DEVICE HAVING CAP

(75) Inventors: Nobutaka Shimizu; Takao Nishimura; Atsushi Kikuchi; Takao Akai; Takumi Ihara, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/443,434

(22) Filed: Nov. 19, 1999

(30) Foreign Application Priority Data

Apr. 27, 1999 (JP) .................................................. 11-119467

(51) Int. Cl.⁷ .................................................... H01L 23/36
(52) U.S. Cl. ...................... 257/704; 257/710; 257/680; 257/676; 257/730; 257/731
(58) Field of Search .................................. 257/676, 704, 257/680, 710, 731, 730, 774, 773, 672, 712, 713

(56) References Cited

U.S. PATENT DOCUMENTS

| | | | |
|---|---|---|---|
| 3,538,597 | * | 11/1970 | Leinkram et al. .................... 257/704 |
| 4,513,353 | * | 4/1985 | Bakermans et al. ................. 341/399 |
| 5,148,264 | * | 9/1992 | Satriano ............................... 257/704 |
| 5,436,402 | * | 7/1995 | Eehr et al. ............................ 257/710 |
| 5,468,910 | * | 11/1995 | Knapp et al. ........................ 257/704 |
| 5,579,212 | * | 11/1996 | Albano et al. ....................... 257/704 |
| 5,644,247 | * | 7/1997 | Hyan et al. .......................... 324/755 |
| 5,656,864 | * | 8/1997 | Mitsue et al. ........................ 257/704 |
| 5,905,301 | * | 5/1999 | Ichikawa et al. .................... 257/675 |
| 5,909,057 | * | 6/1997 | McCormick et al. ............... 257/704 |
| 5,994,784 | * | 11/1999 | Ahad .................................... 257/784 |
| 6,011,303 | * | 1/2000 | Tanaka et al. ....................... 257/692 |

FOREIGN PATENT DOCUMENTS 6-61383    3/1994   (JP) .

* cited by examiner

*Primary Examiner*—Alexander O. Williams
(74) *Attorney, Agent, or Firm*—Armstrong, Westerman, Hattori, McLeland & Naughton, LLP

(57) ABSTRACT

The semiconductor device includes a substrate, a semiconductor component, and a cap covering the semiconductor component and attached to the substrate. The cap has a top wall, a plurality of side walls 14 extending downward from the top wall and a bottom wall. Opening are provided in the side walls of the cap at corners thereof. Due to the provision of openings, the cap can be manufactured without deformation thereof. Air or liquid can flow into, or out of, the interior of the cap, after the semiconductor deviced is completed.

6 Claims, 9 Drawing Sheets

SEMICONDUCTOR DEVICE HAVING CAP

BACKGROUND OF THE INVENTION

1. Field of the Invention

The present invention relates to a semiconductor device having a cap.

2. Description of the Related Art

A semiconductor device includes a substrate and a semiconductor component mounted to the substrate. The semiconductor component may be, for example, a semiconductor chip or a semiconductor package. There is a semiconductor device wherein a cap covers the semiconductor component and is attached to the substrate to protect the semiconductor component.

Japanese Unexamined Patent Publication No. 6-61383 discloses a semiconductor device having a cap. In this semiconductor device, a semiconductor chip is mounted to the bottom of a box-like ceramic package having a top opening and a cap is formed as a generally flat plate to be placed on the box-like ceramic package. Resin surrounds the semiconductor chip so that the upper portion of the semiconductor chip is exposed from the resin. A solder layer is disposed on the semiconductor chip and the resin, and the cap is placed above the solder layer. In this way, the semiconductor device protected from external force and excellent in the heat-dissipation ability is obtained. In addition, this flat cap has a vent hole.

In the prior art disclosed in the above-mentioned Japanese Unexamined Patent Publication No. 6-61383, the flat cap is attached to the box-like ceramic package having a top opening. Contrarily, there are other many semiconductor devices wherein a cap in the inverted cup shape is attached to a flat substrate.

The cap in the inverted cup shape is manufactured by a machining process such as a rotational cutting or a metal drawing. The cap manufactured by the rotational cutting is relatively expensive, and the cap obtained by the metal drawing is relatively inexpensive. Therefore, the cap obtained by the metal drawing is often used preferably. However, the cap obtained by the metal drawing has a drawback in that a stress is liable to concentrate on the respective corners of the cap during the drawing operation and causes a strain therein to result in a warpage of the cap.

Also, in the structure wherein a semiconductor chip is mounted to a substrate by flip-chip bonding, an underfill resin is filled in a gap between the substrate and the semiconductor chip. The semiconductor chip is adhered to a cap with an adhesive. The underfill resin or the adhesive generates gas or releases solvent therefrom when being cured. The gas and solvent deteriorate the adhesive which bonds the cap to the substrate. Also, there is a problem in that the gas or solvent expands in the interior of the tightly sealed cap and causes the cap to deform.

Therefore, if an opening is provided in the cap, the gas or solvent is released out of the cap, so the adhesive is not deteriorated and the cap is not deformed. In the semiconductor device disclosed in the above-mentioned Japanese Unexamined Patent Publication No. 6-61383, an opening is provided in the cap, but there is a solder layer and the opening is blocked by the solder layer. Accordingly, the gas or solvent generated or released from the adhesive or the like disposed under the solder layer is not released beyond the solder layer.

Also, electronic elements (such as a capacitor or a resistor) as well as a semiconductor chip may be mounted to the semiconductor device with solder to improve the performance of a semiconductor device. The substrate itself may be provided with solder bumps for connecting it to another substrate, a mother board or the like. In such a semiconductor device, the solder is washed after the electronic elements have been mounted to the substrate, the cap is then fitted to the substrate to tightly seal the electronic elements, thereafter, the solder bumps are formed on the substrate, and the solder is again washed. Thus, it is necessary to wash the solder twice.

SUMMARY OF THE INVENTION

An object of the present invention is to provide a semiconductor device having a cap which is free from warpage even if the cap is manufactured through a metal drawing process, and from which gas or liquid can be released.

A semiconductor device according to the present invention comprises a substrate, a semiconductor component mounted to the substrate, and a cap covering the semiconductor component and attached to the substrate the cap having a top wall, a plurality of side walls extending downward from the top wall, corners between respective two adjacent side walls, and openings provided in the side walls at the corners. For example, the semiconductor component is one of a semiconductor chip and a semiconductor package.

In this structure, the corners between the respective two adjacent side walls are portions on which a stress is concentrated when the cap is manufactured by a metal drawing operation. Because the openings are provided in the corners, the concentration of stress on the corners when the cap is fabricated is mitigated, and the cap is not deformed and warped resulting in a product of an accurate shape. Also, it is possible to release gas or liquid out of the interior of the cap through the opening. Particularly, since the openings are provided in the corners, it is possible to wash the solder in the interior of the cap even after the cap has been attached to the substrate. In such a case, the opening allows a washing liquid to flow into and out from the interior of the cap.

Preferably, a thermally conductive paste is disposed between the semiconductor component and the cap. Preferably, the cap is further provided with a bottom wall connected to the side walls and having slits connected to the openings.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

The present invention will be described in detail below with reference to the preferred embodiments illustrated in the attached drawings.

Figure 1:
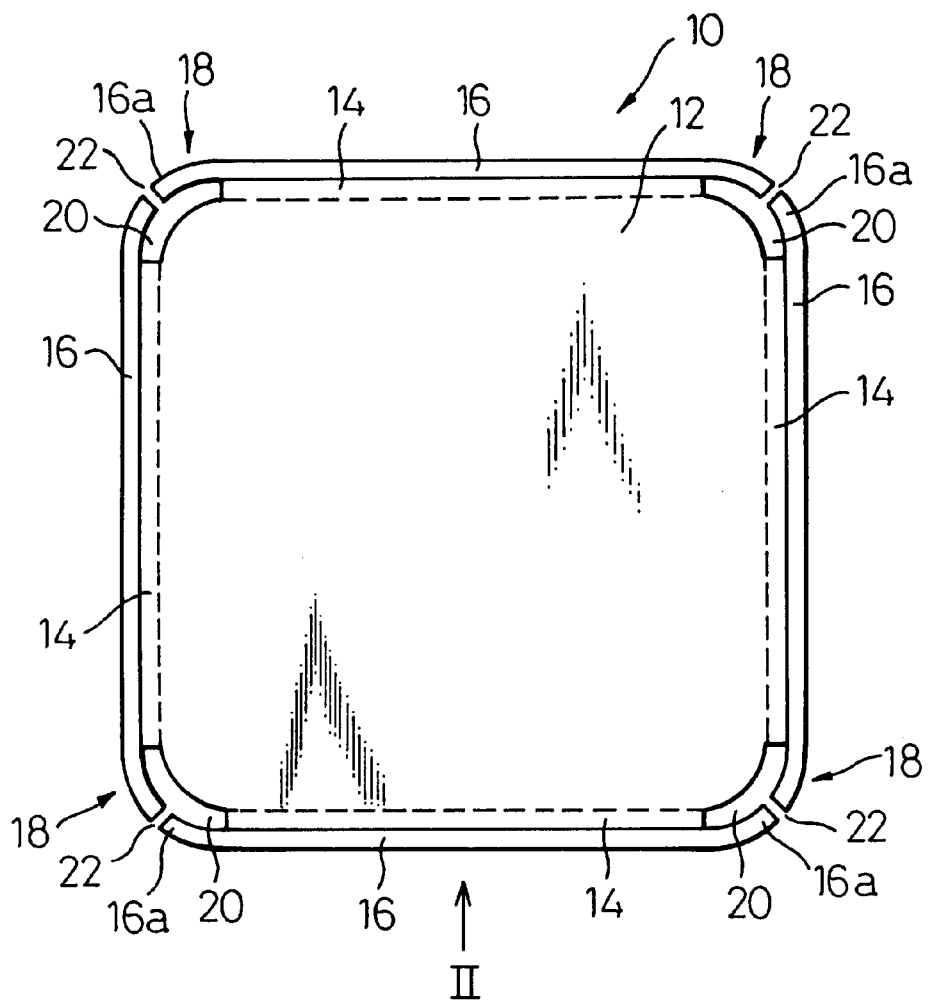
FIG. 1 is a plan view of an embodiment of a cap used in a semiconductor device according to the present invention.
Figure 2:
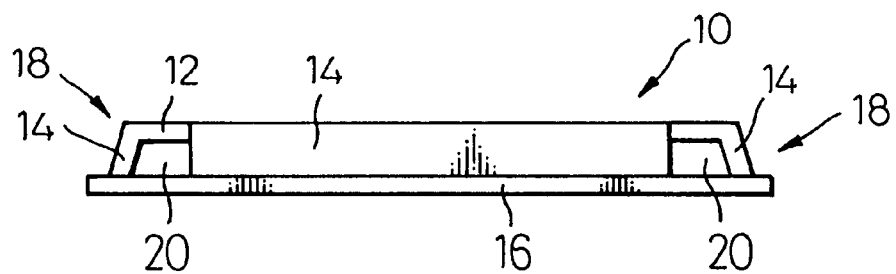
FIG. 2 is a side view of the cap of FIG. 1 as seen in the direction of arrow II in FIG. 1.

FIG. 1 is a plan view illustrating an example of a cap used in the present invention. FIG. 2 is a side view of the cap as seen in the direction of arrow II in FIG. 1. The cap 10 is of a square shape, when seen in a plan view, and has a top wall 12, a plurality of side walls 14 extending downward from the top wall 12, and an annular bottom wall 16, of a square shape, connected to the lower edges of the side walls 14. The top wall 12 and the bottom wall 16 are flat, respectively, and extend in parallel to each other. The side walls 14 are portions of the cap 10 disposed between the top wall 12 and the bottom wall 16, and obliquely extend at an angle nearly perpendicular to the top wall 12.

Openings 20 are provided at corners 18 between respective adjacent two side walls 14. The openings 20 are arranged elongatedly along the bottom wall 16 in the region of the side walls 14 between the top wall 12 and the bottom wall 16. Since the corners 18 are formed in an arcuate shape, the openings 20 are of an elongated arcuate shape. The openings 20 are provided only in the curved portions of the side walls 14 defining the corners 18 of the side walls 14, and are not provided in the straight portions of the side walls 14.

Due to the provision of the openings 20, the corners of the bottom wall 16 are formed in the bridge-like strip portions 16a. The bridge-like strip portions 16a have slits 22 connected to the openings 20. The slits 22 in the corners of the bottom wall 16 divide the bridge-like strip portions 16a and are formed as narrow as possible.

Figure 3:
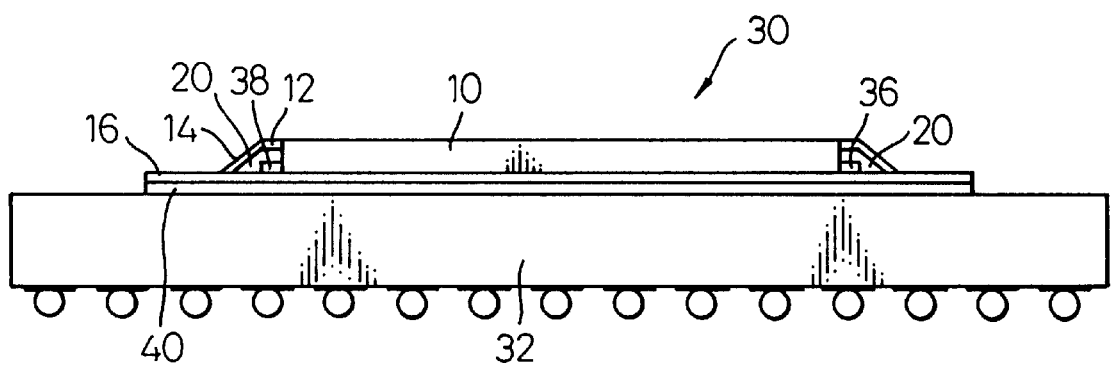
FIG. 3 is a side view of a semiconductor device according to the embodiment of the present invention, including the cap shown in FIGS. 1 and 2.
Figure 4:
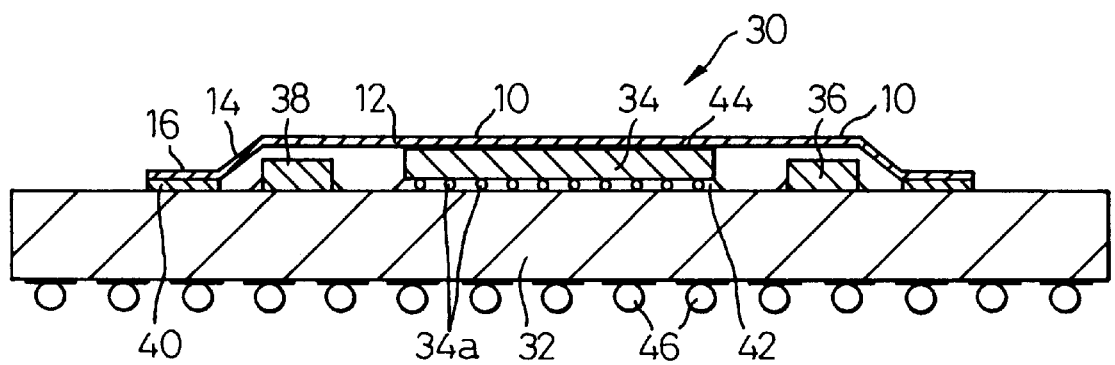
FIG. 4 is a cross-sectional view of the semiconductor device of FIG. 3 taken along a plane passing through the center line of the semiconductor device.

FIGS. 3 and 4 illustrate one embodiment of a semiconductor device 30 including the cap 10 of FIGS. 1 and 2. FIG. 3 is a side view of the semiconductor device 30 and FIG. 4 is a cross-sectional view taken along a plane passing through the center line of the semiconductor device 30. The semiconductor device 30 includes a substrate 32, a semiconductor chip 34 which is a semiconductor component mounted to the substrate 32, and the cap 10 covering the semiconductor component 34 and attached to the substrate 32. Electronic parts other than the semiconductor chip 34, for example, a capacitor 36 and a resistor 38, may be soldered to the substrate 32 and also covered by the cap 10. The cap 10 is fixed to the substrate 32 with an adhesive 40 (such as an epoxy resin type adhesive containing glass fibers). As described above, the cap 10 has the top wall 12, the side walls 14 and the bottom wall 16, with the openings 20 provided at the corners 18 between respective adjacent two side walls 14.

The semiconductor chip 34 is fixed to the substrate 32 by a flip-chip bonding. That is, the semiconductor chip 34 has solder bumps (solder balls) 34a provided on electrode pads thereof, which are connected to electrode pads of the substrate 32. An underfill adhesive (such as epoxy resin type adhesive containing $SiO_2$ filler) 42 is filled in the gap between the semiconductor chip 34 and the substrate 32, to mold the connecting portion between the semiconductor chip 34 and the substrate 32. Further, a thermally good conductive paste (such as epoxy resin containing Ag filler) 44 is coated on the surface of the semiconductor chip 34 to fix the cap 10 to the semiconductor chip 34. Solder bumps (solder balls) 46 are provided on the electrode pads formed in the surface of the substrate 32 opposite to the surface thereof carrying the cap 10. A space is defined between the cap 10 and the substrate 32.

In the above embodiment, the corners 18 between respective adjacent two side walls 14 of the cap 10 are portions on which a stress concentrates during the manufacturing operation of the cap 10. Particularly, when the cap 10 is manufactured through a metal drawing process, a stress is liable to concentrate on the corners 18 to generate a deformation in this region. According to the present invention, since the openings 20 are provided at the corners 18, the concentration of stress on the corners 18 is mitigated, so the cap is not deformed and thus the cap 10 is not warped, so that it is possible to obtain an accurate shape of the cap 10. In other words, the bottom wall 16 of the cap 10 (or the bottom surface of the side walls 14 if there is no bottom wall 16) is flattened to just fit onto the substrate 32.

In addition, it is possible to release gas or liquid out of the interior of the cap 10 through the openings 20 under the condition when the cap 10 is fixed to the substrate 32. That is, even if gas or solvent is generated from the adhesive 40, 42 or the paste 44, such gas or solvent is released outside of the cap 10 through the openings 20, whereby the deterioration of the adhesive due to the imprisonment of gas or solvent in the interior of the cap or the deformation of the cap 10 due to the expansion of thereof is avoidable. For example, the paste 44 is a thermosettable resin and generates an outgas when heated after the cap 10 has been attached.

In addition, since a washing liquid for solder can freely flow into and out of the interior of the cap 10 through the openings 20, it is possible to simultaneously wash the capacitor 36, the resistor 38 and the solder bumps 46 after the cap 10 is attached to the substrate 32, whereby the manufacturing process is simplified. Note that, if an opening (referred to opening X herein) were provided in the top wall 12 of the cap 12 at a position distant inward from the side walls 14, it would be impossible to bring the opening X to a lowest level of the cap 10 even if the semiconductor device (the cap 10) is tilted. Thus, the interior space of the cap 10 located lower than the opening X forms a well, from which the washing liquid is not released through the opening. Thereby, since the washing liquid for solder is not released from the interior space of the cap 10, it is impossible to wash the capacitor 36 or the resistor 38 within the cap 10 after the cap 10 has been attached.

According to the present invention, since the openings 20 are provided at the corners 18 of the cap 10, the openings 20 are easily brought into the lowest position in the cap 10 when the semiconductor device 30 (the cap 10) is once tilted, whereby it is possible to easily and assuredly release the washing liquid through the openings 20. Accordingly, the capacitor 36, the resistor 38 and the solder bumps 46 provided in the substrate 32 within the cap 10 are simultaneously washable to simplify the manufacturing process.

In addition, the openings 20 of the cap 10 are kept in an open state even after the completion of the semiconductor device 30. Therefore, an ambient air can be freely communicated with the interior of the cap 10 through the openings 20. The air flowing into the interior of the cap 10 is in contact with the inner surface of the cap 10 to cool the same. The ambient air is also in contact with the outer surface of the cap 10 to cool the same. That is, by keeping the openings 20 of the cap 10 in an open state, a heat dissipation area becomes larger to improve the cooling efficiency.

The cap 10 may be made of various materials by various methods. For example, the cap 10 is made of ductile metal such as Cu or Al. Or, the cap 10 may be made of ceramic, CuW, AlSi or AlSiC.

Figure 5A:
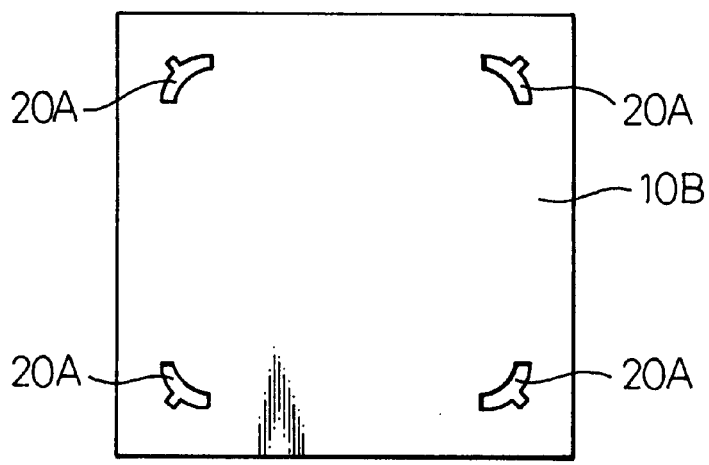
FIGS. 5A to 5C are views illustrating an example of manufacturing the cap by a metal drawing.
Figure 5B:
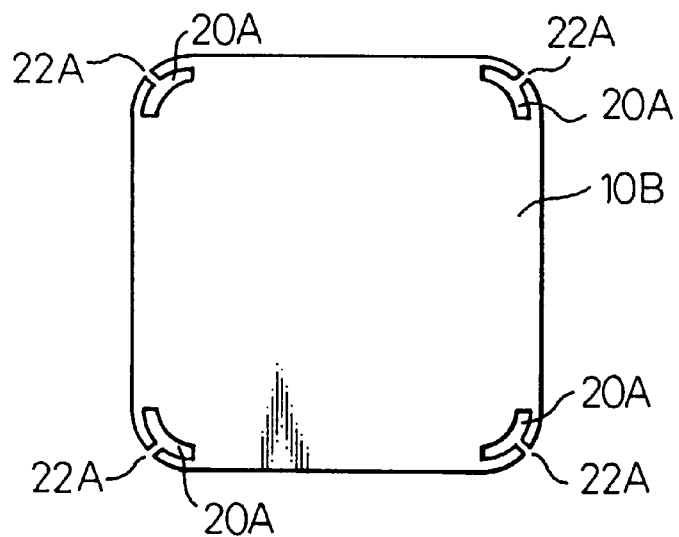
Figure 5C:
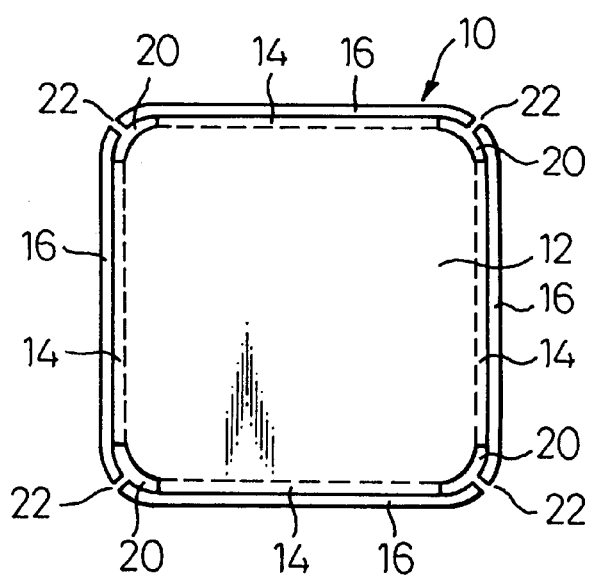

Preferably, the cap 10 may be formed of metallic material via a metal drawing process. FIG. 5 illustrates the steps for forming the cap 10 by the metal drawing process. As shown in FIG. 5A, a metallic plate 10B is prepared and holes 20A to be the openings 20 are punched by a press. As shown in FIG. 5B, corners of the metallic plate 10B are cut off by a press so that slits 22A to be the slits 22 are open to the outside. Then, as shown in FIG. 5C, the metallic plate 10B is subjected to a metal drawing operation by a press to result in the cap 10 shown in FIGS. 1 and 2.

At that time, since the openings 20 are formed at the respective corners 18, on which a stress is liable to concentrate during the metal drawing operation, the concentration of stress is mitigated during the metal drawing operation, whereby no strain is generated to result in the cap 10 free from the warpage. Moreover, since the bridge-like strip portion 16a is provided, a contact area between the substrate 32 and the cap 10 becomes larger to strengthen the bonding of the cap 10 to the substrate 32. If the bridge-like strip 16a is cut at a middle point thereof to form the slit 22, the stress is further reduced to result in a cap 10 having a high flatness in the bottom wall 16. In such a manner, it is possible to accurately and inexpensively manufacture a cap 10 in the inverted cup shaped through a metal drawing process using a press.

Figure 6:
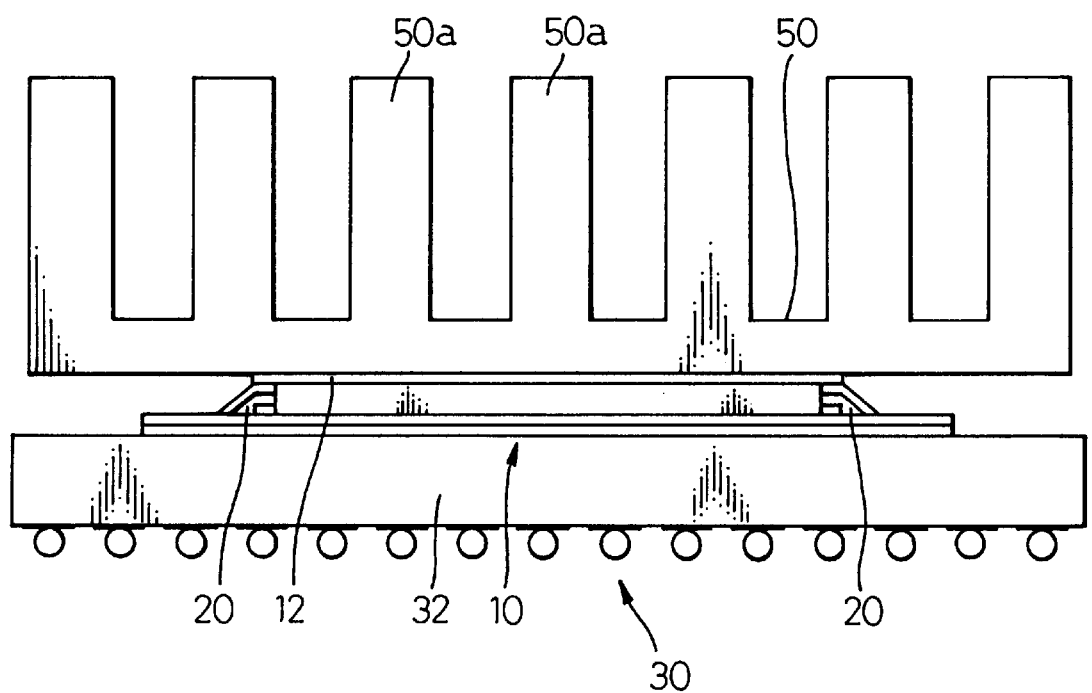
FIG. 6 is a view illustrating a modification of the embodiment of the semiconductor device shown in FIGS. 3 and 4.

FIG. 6 illustrates a modification of the embodiment shown in FIGS. 3 and 4. A semiconductor device 30 is basically of the same structure as in the embodiment described above with reference to FIGS. 1 to 4. According to this semiconductor device 30, a heat sink 50 with fins 50a is attached to the top wall 12 of the cap 10. Openings 20 are provided at corners 18 of the cap 10 and normally open to carry out the above-mentioned operation, irrespective of the existence of the heat sink 50.

Figure 7:
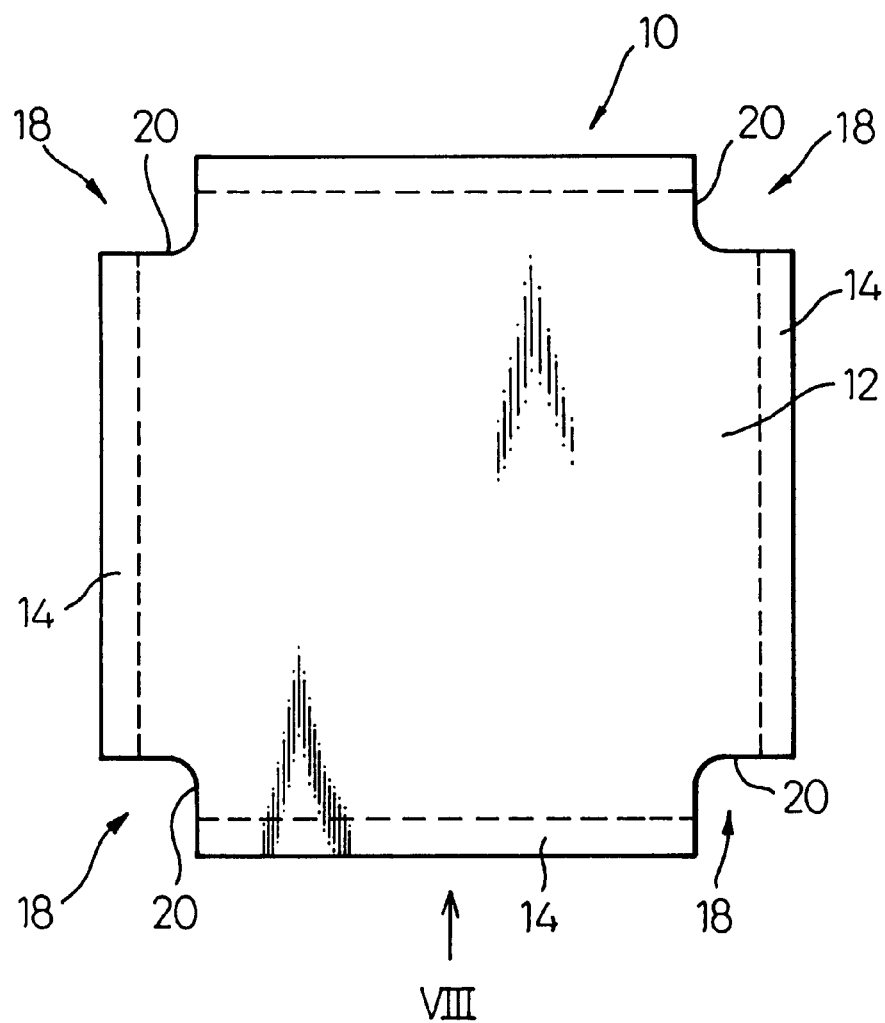
FIG. 7 is a plan view of another example of the cap used in the semiconductor device according to the present invention.
Figure 8:
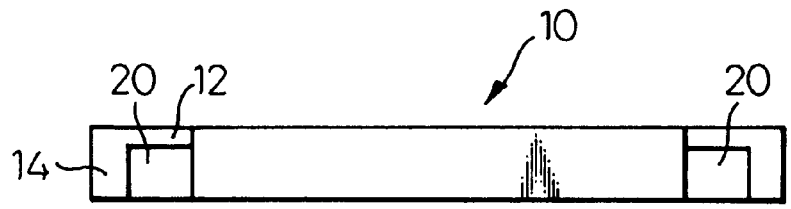
FIG. 8 is a side view of the cap of FIG. 7 as seen in the direction of arrow VII in FIG. 7.

FIG. 7 is a plan view of another embodiment of the cap used for a semiconductor device according to the present invention. FIG. 8 is a side view of the cap shown in FIG. 7, as seen in the direction of arrow VII in FIG. 7. The cap 10 is generally of a square shape as seen from above, and has a top wall 12 and a plurality of side walls 14 extending downward in the vertical direction from the top wall 12. Corners 18 are defined between respective two adjacent side walls 14, and openings 20 are provided at the respective corners 18. The opening 20 includes a corner position of the top wall 12 and extends from the top wall 12 to the side walls 14 to be generally of a square shape.

While the side walls 14 are defined at an angle larger than 90 degrees relative to the top wall 12 in the embodiment shown in FIGS. 1 to 6, according to the embodiment shown in FIGS. 7 and 8, the side walls 14 extend at a right angle relative to the top wall 12, and there is no bottom wall 16, unlike the preceding embodiment. The cap 10 of the embodiment shown in FIGS. 7 and 8 is suitable for being manufactured by a rotational cutting operation.

Figure 9:
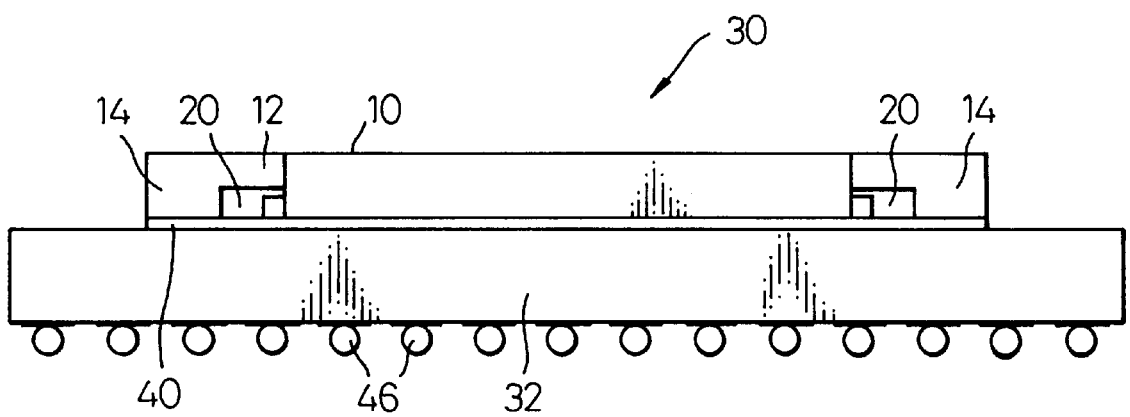
FIG. 9 is a side view of a semiconductor device according to the embodiment of the present invention, including the cap shown in FIGS. 7 and 8.
Figure 10:
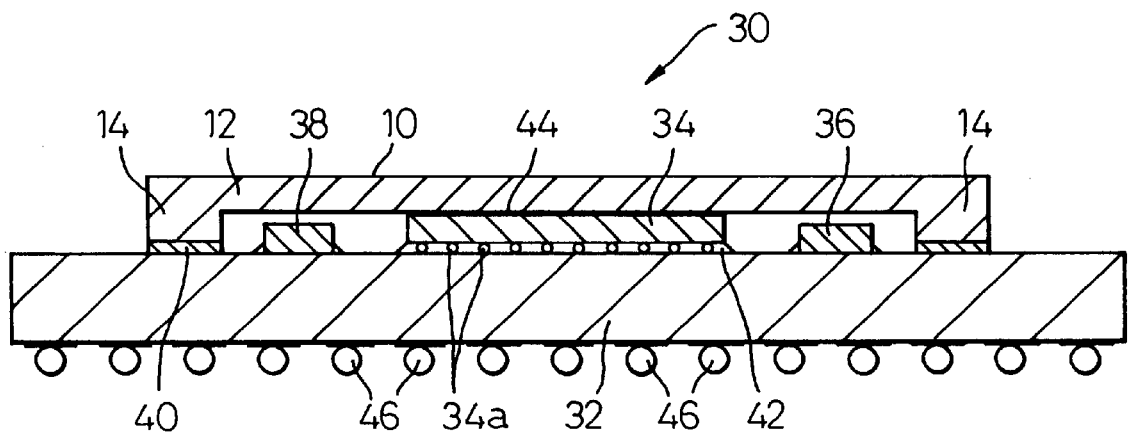
FIG. 10 is a cross-sectional view of the semiconductor device of FIG. 9 taken along a plane passing through the center line of the semiconductor device of FIG. 9.

FIG. 9 illustrates a further embodiment of a semiconductor device 30 including the cap 10 shown in FIGS. 7 and 8. FIG. 10 is a cross-sectional view taken along a plane passing through the center line of the semiconductor device 30 shown in FIG. 9. The semiconductor device 30 has a substrate 32, a semiconductor chip 34 constituting a semiconductor component mounted to the substrate 32, and a cap 10 covering the semiconductor component 34 and attached to the substrate 32. In the interior of the semiconductor device 30, there are the semiconductor chip 34, a capacitor 36, a resistor 38 or the like.

The cap 10 is bonded to the substrate 32 with an adhesive 40. The semiconductor chip 34 is fixed to the substrate 32 by a flip-chip bonding. That is, the semiconductor chip 34 is connected to electrode pads of the substrate 32 via solder bumps 34a. An underfill adhesive 42 is filled in a gap between the semiconductor chip 34 and the substrate 32. In addition, a thermally conductive paste 44 is coated on the surface of the semiconductor chip 34 so that the cap 10 is bonded to the semiconductor chip 34. Further, the solder bumps 46 are provided on electrode pads formed on the surface of the substrate 32 opposite to cap 10.

In the cap 10, openings 20 are provided at corners 18 between respective two adjacent side walls 14. Note, there is no problem caused by the concentration of stress on the corners 18 since the cap 10 is manufactured by a rotational cutting operation. Other than the above, the openings 20 of this embodiment have the same function is as that of the openings 20 of the preceding embodiment, except for the function of mitigating the deformation.

That is, gas and liquid are released out of the interior of the cap 10 through the openings 20. Since gas or solvent generated from the adhesive 40, 42 or the paste 44 can be released out of the interior of the cap 10 through the openings 20, there is no problem in that the cap 10 deforms due to the expansion of the gas or solvent which might be sealed within the interior of the cap 10. In addition, since the openings 20 are provided at the corners 18 of the cap 10, it is possible to wash the capacitor 36 or the resistor 36 located within the cap 10 even after the cap 10 has been attached to the substrate 32. Therefore, the capacitor 36, the resistor 38 and the solder bumps 46 can be simultaneously washed to simplify the manufacturing process. Since the deformation is minimized even if the cap 10 is manufactured by the metal drawing, a stress applied to the semiconductor chip 34 becomes smaller to result in the reliable electric connection.

The openings 20 of the cap 10 are left open after the completion of the semiconductor device 30.

Therefore, an ambient air freely flows into and out of the interior of the cap 10 through the openings 20. The air flowing into the interior of the cap 10 is brought into contact with the inner surface of the cap 10 to cool the same. The ambient air is also brought into contact with the outer surface of the cap 10 to cool the same. Accordingly, it is possible to improve the cooling capacity by leaving the openings 20 of the cap 10 in an open state.

Figure 11:
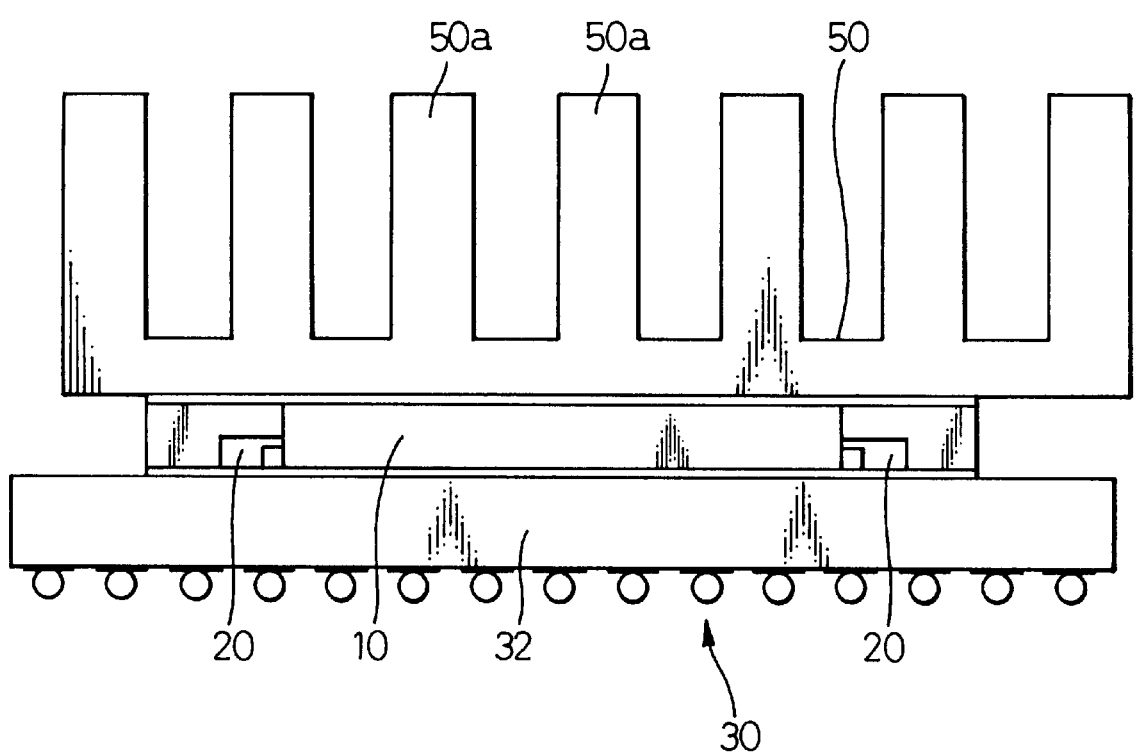
FIG. 11 is a view illustrating a modification of the embodiment shown in FIGS. 9 and 10.

FIG. 11 illustrates a modification of the embodiment shown in FIGS. 9 and 10. A semiconductor device 30 is basically of the same structure as described with reference to FIGS. 9 and 10. In this semiconductor device 30, a heat sink 50 having fins 50a is attached to the top wall 12 of the cap 10. Openings 20 are provided at corners 18 of the cap 10 and are always open to carry out the above-mentioned operation, irrespective of the existence of the heat sink 50.

Figure 12:
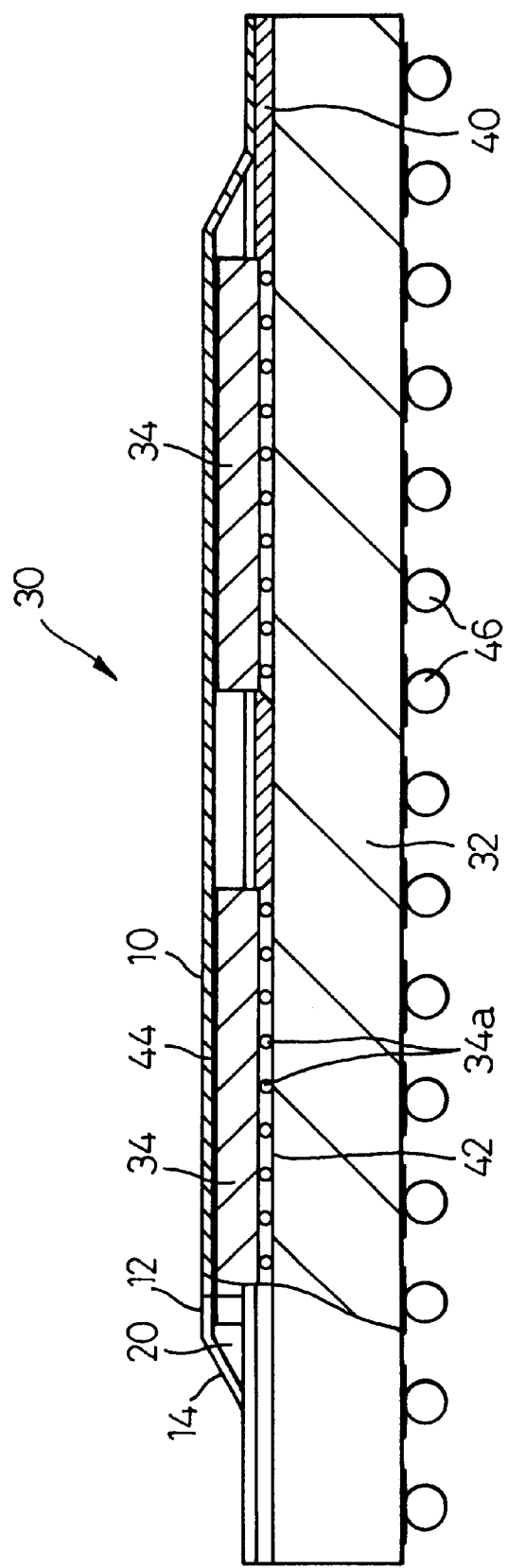
FIG. 12 is a cross-sectional view of a further embodiment of the present invention.

FIG. 12 is a cross-sectional view of a further embodiment of the present invention. A semiconductor device 30 of this embodiment is formed as a multi-chip module (MCM) wherein two semiconductor chips 34 are mounted to a substrate 32. The respective semiconductor chip 34 is attached to the substrate 32 by a flip-chip bonding. A cap 10 is attached to the substrate 32 to cover the two semiconductor chips 34. The cap 10 has openings 20 at corners 18, each defined between every adjacent two side walls 14 in the same manner as in the cap 10 shown in FIGS. 1 and 2. The cap 10 is fixed to the substrate 32 with an adhesive 40, and an underfill adhesive 42 is filled in a gap between the semiconductor chip 34 and the substrate 32. A heat-conductive paste 44 bonds the semiconductor chip 34 with the cap 10.

Figure 13:
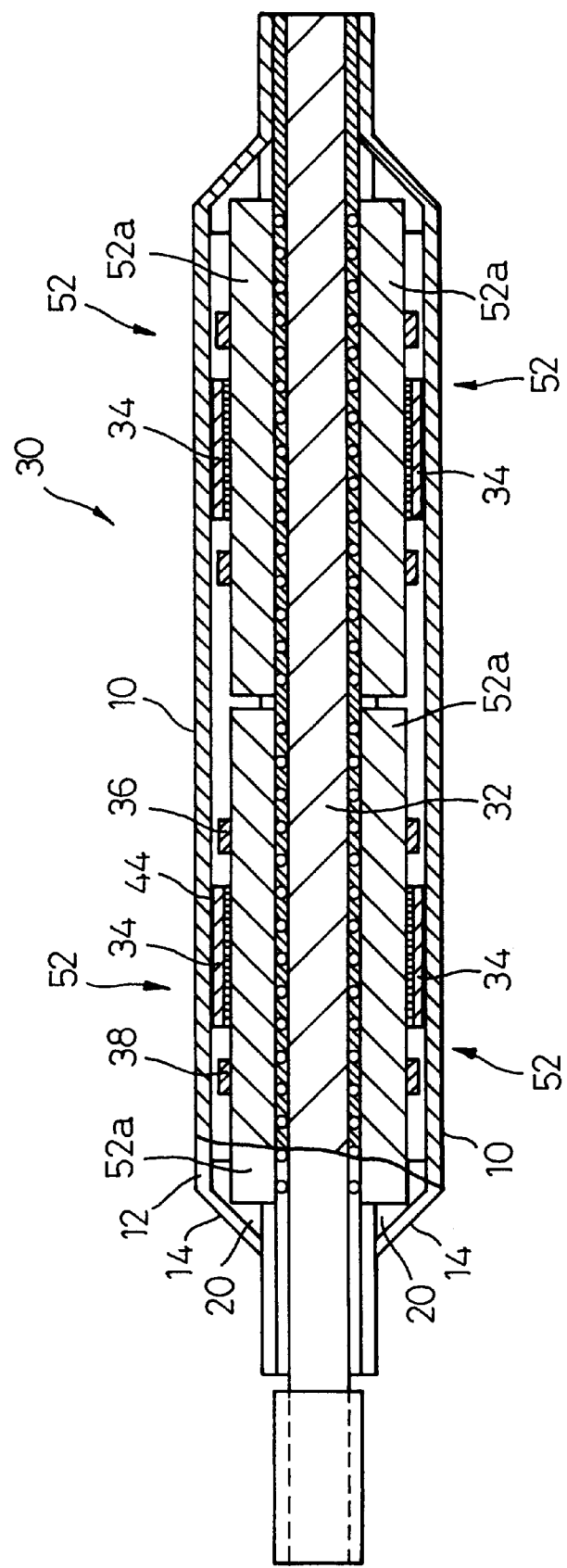
FIG. 13 is a cross-sectional view of a further embodiment of the present invention.

FIG. 13 is a sectional view of a further embodiment of the present invention. In a semiconductor device 30 of this embodiment, two semiconductor packages 52 are mounted to each of opposite sides of a substrate 32. The respective semiconductor package 52 includes a semiconductor chip 34 mounted to a substrate 52a by a flip-chip bonding. Further, the semiconductor package 52 is mounted to the substrate 32 by a flip-chip bonding. A cap 10 is attached to the substrate 32 to cover the semiconductor packages 52 constituting semiconductor components. The cap 10 has openings 20 at corners 18, each defined between every adjacent two side walls 14 in the same manner as in the cap 10 shown in FIGS. 1 and 2. The cap 10 is fixed to the substrate 32 with an adhesive 40, and an underfill adhesive 42 is filled in a gap between the semiconductor chip 34 and the substrate 32. A heat-conductive paste 44 bonds the semiconductor chip 34 with the cap 10.

The openings 20 provided in the cap 10 of FIGS. 12 and 13 have the same function as that of the openings 20 in the preceding embodiments. In all the embodiments, the cap 10 protects the semiconductor chip 34 or the semiconductor package 52 and facilitates the heat dissipation. A heat sink having fins may be suitably provided. Since liquid can freely flow into and out of the interior of the cap 10, it is possible to carry out immersion type liquid cooling.

As described hereinabove, according to the present invention, the openings are provided at corners of the cap and left in an open state even after the completion of the semiconductor device, gas generated during the manufacturing process can be vented through the openings, and a washing liquid can flow into and out of the interior of the cap through the openings. Also, it is possible to use the inner surface of the cap as a heat dissipation surface. When the cap is manufactured by a drawing operation of metallic sheet, a strain is minimized because corners of the metallic sheet having a maximum strain are cut off to provide openings. In addition, since the bridge-like strip portion are provided outside of the openings at the corners, it is possible to increase a contact area of the cap with the substrate so that the cap is more firmly bonded to the substrate. If the bridge-like strip portions are cut at a middle point thereof, a cap having an improved flatness is obtainable.

What is claimed is:

1. A semiconductor device comprising:

a substrate;

a semiconductor component mounted to said substrate; and a cap covering said semiconductor component and attached to said substrate, said cap having a top wall, a plurality of side walls extending downward from the top wall, corners between respective two adjacent side walls, a bottom wall connected to the side walls, said bottom wall having slits connected to said openings at the corners of the side walls, and openings provided in the side walls at side corners, wherein the substrate and the cap form an interior space therein.

2. A semiconductor device as defined by claim 1, wherein said semiconductor component comprises one of a semiconductor chip and a semiconductor package having a semiconductor chip.

3. A semiconductor device as defined by claim 1, wherein a thermally conductive paste is disposed between the semiconductor component and the cap.

4. A semiconductor device as defined by claim 1, characterized in that the cap further comprises a bottom wall connected to the side walls having slits, each communicating with the opening at the corner of the side wall.

5. A semiconductor device as defined by claim 1, wherein the openings are provided only at the side corners.

6. A semiconductor device as defined by claim 1, wherein the openings do not extend to the top wall.

* * * * *